United States Patent
Felix et al.

(10) Patent No.: US 10,727,055 B2
(45) Date of Patent: *Jul. 28, 2020

(54) METHOD TO INCREASE THE LITHOGRAPHIC PROCESS WINDOW OF EXTREME ULTRA VIOLET NEGATIVE TONE DEVELOPMENT RESISTS

(71) Applicant: INTERNATIONAL BUSINESS MACHINES CORPORATION, Armonk, NY (US)

(72) Inventors: Nelson M. Felix, Briarcliff Manor, NY (US); Martin Glodde, Pine Brook, NJ (US); Dario L. Goldfarb, Dobbs Ferry, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 24 days.

This patent is subject to a terminal disclaimer.

(21) Appl. No.: 15/429,871

(22) Filed: Feb. 10, 2017

(65) Prior Publication Data

US 2018/0233352 A1    Aug. 16, 2018

(51) Int. Cl.
  *H01L 21/027*   (2006.01)
  *H01L 29/04*   (2006.01)
  (Continued)

(52) U.S. Cl.
  CPC ........ *H01L 21/0274* (2013.01); *G03F 7/0392* (2013.01); *G03F 7/16* (2013.01);
  (Continued)

(58) Field of Classification Search
  CPC ... H01L 21/0274; H01L 29/04; H01L 21/321; H01L 21/32139; H01L 21/30604;
  (Continued)

(56) References Cited

U.S. PATENT DOCUMENTS 4,960,675 A * 10/1990 Tsuo ............... G03F 7/0043
                                                          250/492.3
5,759,745 A *  6/1998 Hollingsworth ...... G03F 7/0042
                                                          430/313

(Continued)

OTHER PUBLICATIONS

Cicero, R.L. et al., "Photoreactivity of Unsaturated Compounds with Hydrogen-Terminated Silicon(111)" American Chemical Society (May 2000) pp. 5688-5695, vol. 16, No. 13.

(Continued)

*Primary Examiner* — Savitri Mulpuri
(74) *Attorney, Agent, or Firm* — Tutunjian & Bitetto, P.C.; Vazken Alexanian (57) ABSTRACT

A patterning method that includes providing an amorphous semiconductor surface to be patterned, and terminating the amorphous semiconductor surface by forming silicon-hydrogen (Si—H) on the surface to be patterned. A photoresist is formed on the surface to be patterned. The photoresist is then lithographically patterned using an extreme ultra violet (EUV) method. A photoresist is then developed on the surface to be patterned using negative tone development (NTD).

11 Claims, 5 Drawing Sheets

(51) Int. Cl.
*H01L 21/308* (2006.01)
*H01L 21/306* (2006.01)
*H01L 21/321* (2006.01)
*H01L 21/3213* (2006.01)
*G03F 7/039* (2006.01)
*G03F 7/16* (2006.01)
*G03F 7/32* (2006.01)

(52) U.S. Cl.
CPC .......... *G03F 7/325* (2013.01); *H01L 21/3081* (2013.01); *H01L 21/3086* (2013.01); *H01L 21/30604* (2013.01); *H01L 21/321* (2013.01); *H01L 21/32139* (2013.01); *H01L 29/04* (2013.01)

(58) Field of Classification Search
CPC . H01L 21/3081; H01L 21/3086; G03F 7/325; G03F 7/0392; G03F 7/16
See application file for complete search history.

(56) References Cited

U.S. PATENT DOCUMENTS

| | | | |
|---|---|---|---|
| 6,372,581 B1 | 4/2002 | Bensahel et al. | |
| 6,670,638 B2* | 12/2003 | Tamura | G02F 1/1368 257/52 |
| 6,803,309 B2* | 10/2004 | Chou | H01L 21/76802 134/1.1 |
| 7,253,113 B2* | 8/2007 | Cheng | G03F 7/405 257/E21.026 |
| 7,851,140 B2 | 12/2010 | Tsubaki | |
| 8,129,080 B2* | 3/2012 | Fonseca | G03B 27/54 430/30 |
| 8,163,468 B2* | 4/2012 | Hishiro | G03F 7/7065 430/322 |
| 8,216,767 B2* | 7/2012 | Wang | G03F 7/0045 430/270.1 |
| 8,367,158 B2* | 2/2013 | Uchiyama | B41J 2/14233 427/2.31 |
| 8,642,253 B2 | 2/2014 | Tsubaki | |
| 8,790,867 B2* | 7/2014 | Bae | G03F 7/0397 430/325 |
| 8,821,985 B2* | 9/2014 | Shao | C23C 16/04 427/532 |
| 8,999,625 B2* | 4/2015 | Glodde | G03F 7/0757 430/270.1 |
| 9,159,582 B2 | 10/2015 | OuYang et al. | |
| 9,379,340 B1 | 6/2016 | Afzali-Ardakani et al. | |
| 9,379,342 B1 | 6/2016 | Afzali-Ardakani et al. | |
| 9,423,689 B2* | 8/2016 | Yamaguchi | C08F 20/10 |
| 9,448,483 B2* | 9/2016 | Hustad | G03F 7/325 |
| 9,459,536 B1* | 10/2016 | Lai | C07C 69/12 |
| 9,741,820 B2 | 8/2017 | Han et al. | |
| 9,772,558 B2* | 9/2017 | Ayothi | G03F 7/325 |
| 10,096,477 B2* | 10/2018 | Glodde | H01L 21/0274 |
| 2004/0256351 A1* | 12/2004 | Chung | C23C 16/34 216/13 |
| 2006/0138392 A1 | 6/2006 | Bowden et al. | |
| 2013/0129995 A1* | 5/2013 | Ouattara | G03F 7/092 428/209 |
| 2013/0171574 A1* | 7/2013 | Xu | G03F 7/38 430/325 |
| 2014/0120459 A1* | 5/2014 | Liu | G03F 1/00 430/5 |
| 2014/0308819 A1* | 10/2014 | Enokido | H01L 28/92 438/753 |
| 2015/0079792 A1* | 3/2015 | Shigaki | H01L 21/3081 438/703 |
| 2016/0062232 A1* | 3/2016 | Hong | H01L 21/0273 430/325 |
| 2016/0187781 A1* | 6/2016 | Kang | G03F 7/325 430/325 |
| 2016/0343568 A1* | 11/2016 | Dai | H01L 21/32105 |
| 2017/0059993 A1* | 3/2017 | Liu | C08F 220/26 |
| 2017/0097570 A1* | 4/2017 | Tagawa | G03F 7/2022 |
| 2017/0199464 A1* | 7/2017 | Liu | G03F 7/322 |
| 2017/0299963 A1* | 10/2017 | Fujiwara | G03F 7/0392 |
| 2017/0315447 A1* | 11/2017 | Liu | G03F 7/40 |
| 2018/0337048 A1* | 11/2018 | Glodde | H01L 21/0274 |

OTHER PUBLICATIONS

Guerrero, D.J. et al., "BARC surface property matching for negative-tone development of a conventional positive-tone photoresist" Proc. SPIE 7972, Advances in Resist Materials and Processing Technology XCVIII (Apr. 2011) pp. 1-7, vol. 7972.

Khung, Y.L. et al., "Thermal and UV Hydrosilylation of Alcohol-Based Bifunctional Alkynes on Si (111) surfaces: How surface radicals influence surface bond formation" Scientific Reports (Jun. 2015) pp. 1-13, vol. 5, No. 11299.

Tarutani, S. et al., "Functional resist materials for negative tone development in advanced lithography" Proc. of SPIE, Advances in Resist Materials and Processing Technology XXIX (Mar. 2012) pp. 832505-1-832505-8, vol. 8325.

U.S. Office Action issued in U.S. Appl. No. 15/804,508, dated Oct. 5, 2018, pp. 1-8.

* cited by examiner

METHOD TO INCREASE THE LITHOGRAPHIC PROCESS WINDOW OF EXTREME ULTRA VIOLET NEGATIVE TONE DEVELOPMENT RESISTS

BACKGROUND

Technical Field

The present invention generally relates to lithographic materials for extreme ultraviolet (EUV) lithography, and more particularly to inorganic hardmask processing used in EUV lithography.

Description of the Related Art

Semiconductor fabrication typically involves transfer of a pattern from a mask to a resist using lithography, and transfer of the pattern from the resist to a hardmask through etching. The pattern can then be transferred from the hardmask to a semiconductor material through further etching processes. In general, photolithography (in contrast to e-beam lithography, for example) uses light to form an image of the mask on a photoresist material, where the incident light can cause a photo reaction. Light for photolithography has progressed from wavelengths in the range of 436 nm (blue light) to 365 nm (near ultraviolet (UV)) to 248 nm (deep UV) to a wavelength of 193 nm. The wavelength of light has moved to smaller and smaller wavelengths in part because the smallest feature size that can be printed is determined in part by the wavelength. $\lambda$ of the light used. Another factor that can affect the smallest printed feature size is the numerical aperture, NA, of the projection optics. The depth-of-focus (DOF) is also determined by $\lambda$ and the numerical aperture NA, which is also typically a factor in resolving small features. The DOF can relate to a visible change in the image related to exposure dose, line width, sidewall angle, and resist loss. As feature sizes decrease, their sensitivity to focus errors increases.

In extreme ultraviolet lithography (EUVL) the extreme ultraviolet light (which also may be referred to as soft x-ray) has wavelengths from 124 nm down to 10 nm, and in particular for intended semiconductor processing, about 13.5 nm, as generated by a laser-pulsed tin (Sn) plasma source. The 13.5 nm EUV light is currently the focus of the next generation of photolithography tools and processes.

An original image of the features to be formed on a substrate is typically written on a lithography mask, unlike previous longer wavelength light used for lithography, however, EUV light is strongly absorbed by almost all materials. Transmission (i.e., refractive) masks, therefore, cannot be used, and approaches using reflective components for the optics and mask are instead being developed.

The image of the mask features is intended to be transferred to a photoresist on the substrate. In the past photoresists have been positive resists in which the exposed area is made soluble in the developer or negative resists in which the exposed area is made insoluble to the developer. As the wavelength of light becomes smaller, new photoresist materials are also needed. For example, it has been determined that a need exists for ultrathin, e.g., less than 5 nm, inorganic hardmask. e.g., amorphous Si ($\alpha$-Si) and low temperature oxide (LTO), as a direct etch transfer layer for EUV patterning. In comparison to spin on hybrid hardmasks, e.g., SiARC, in future hardmasks improvements are desired in resist thickness budget, higher etch selectivity, lower line width roughness (LWR), improved defect elimination, and wet strippability.

SUMMARY

The methods and structures described herein provide for an ultrathin, e.g., less than 5 nm, inorganic hardmask, e.g., amorphous Si ($\alpha$-Si) or low temperature oxide (LTO), as a direct etch transfer for layer for EUV patterning. The masks provided herein provide an improvement in resist thickness budget, higher etch selectivity, lower line width roughness (LWR), improved defect elimination, and wet strippability. This is provided by treating a semiconductor surface. e.g., amorphous silicon ($\alpha$-Si), to terminate the semiconductor surface with silicon-hydrogen (Si—H) bonds. To terminate the semiconductor surface with silicon hydrogen (Si—H) bonds, a diluted hydrofluoric acid (dHF) may be applied to the semiconductor surface prior to forming the photoresist layer. In a following process step, the photoresist layer may be patterned using negative tone development (NTD) methods.

In one embodiment, a patterning method is provided that includes providing an amorphous semiconductor surface to be patterned, and terminating the amorphous semiconductor surface by forming silicon-hydrogen (Si—H) bonds on the surface to be patterned. A photoresist is formed on the surface to be patterned. The photoresist is then lithographically patterned using an extreme ultra violet (EUV) method. A photoresist is then developed on the surface to be patterned using negative tone development (NTD).

In one embodiment, a patterning method is provided that includes providing an amorphous semiconductor surface to be patterned. Applying a dilute hydrofluoric acid (dHF) to the surface to be patterned to terminate the amorphous semiconductor surface by forming silicon-hydrogen (Si—H) bonds. A photoresist is formed on the surface to be patterned. The photoresist is then lithographically patterned using an extreme ultra violet (EUV) method. A photoresist is then developed on the surface to be patterned using negative tone development (NTD).

In yet another embodiment, an etch process is provided. In one embodiment, the method may being with providing an amorphous semiconductor surface to be etched, and terminating the amorphous semiconductor surface by forming silicon-hydrogen (Si—H) bonds on the surface to be patterned. A photoresist is formed on the surface to be patterned. The photoresist is then lithographically patterned using an extreme ultra violet (EUV) method. A photoresist is then developed into a mask on the surface to be patterned using negative tone development (NTD). The portions of the amorphous semiconductor surface exposed by the mask are then etched, while the portions of the amorphous semiconductor layer that are underlying the mask are not etched.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Principles and embodiments of the present invention relate generally to fabricating microelectronics structures, and the resulting structures formed thereby, using extreme ultraviolet (EUV) lithographic processes. Patterning of small features generated by extreme ultraviolet (EUV) lithography can be limited by a variety of factors, from the photoresist over the substrate to the developer. For example, it has been determined that the adhesion performance between prior photoresist compositions and hardmasks can hinder pattern fidelity. Patterning processes are also impacted by tool and mask limitations. With the always shrinking dimensions of features, and resist thickness, the choice of the substrate used to print the resist onto is important for a successful pattern transfer into the lower layers of the stack. While spin-on silicon materials, such as silicon anti-reflective coating (SiARC), typically offer good resist adhesion, their etch resistance for pattern transfer is inferior to inorganic materials, such as silicon oxide ($SiO_2$), silicon nitride or even amorphous silicon ($\alpha$-Si). However, inorganic surfaces typically lead to pattern collapse or lift off due to poor resist adhesion typically during development.

Typically, for conventional lithographic methods, priming is done using hexamethyldisilazane (HMDS) in order to improve mask adhesion and patterning performance on silicon, e.g., amorphous silicon ($\alpha$-Si) or crystalline silicon (c-Si), or silicon oxide ($SiO_2$), e.g., low temperature oxide (LTO), substrates. Hexamethyldisilazane (HMDS) typically provides adhesion to silicon (Si) or silicon oxide ($SiO_2$) substrates by methylation, but there are apparent limitations as HMDS primed substrates still show more pattern collapse than printing the same features on SiARCs. In summation, it has been determined that resist adhesion following HMDS priming is marginal for high resolution patterning, i.e., sub-40P.

The methods and structures described herein provide for an ultrathin, e.g., less than 5 nm, inorganic hardmask, e.g., amorphous Si ($\alpha$-Si) or low temperature oxide (LTO), as a direct etch transfer for layer for EUV patterning. The masks provided herein provide an improvement in resist thickness budget, higher etch selectivity, lower line width roughness (LWR), improved defect elimination, and wet strippability.

It has been determined that amorphous silicon ($\alpha$-Si) or crystalline silicon (c-Si) can be stripped off its native oxide layer (SiOx) with dilute hydrofluoric (HF) acid, thereby converting the terminal surface functionality from polar (Si—OH) to non-polar (Si—H). It has further been determined that the patterning performance with negative tone development (NTD) or corresponding photoresists is improved with non-polar (Si—H) surfaces in comparison to hexamethyldisilazane (HMDS) primed surfaces. The increase in patterning performance that is achieved through converting a terminal surface functionality from being a polar (Si—OH) surface to a non-polar (Si—H) surface. As will be described in greater detail below, to convert the terminal surface to a non-polar (Si—H) surface, the surface may be treated with a dilute hydrofluoric (dHF) acid rinse. It has been determined that when an amorphous silicon ($\alpha$-Si) surface is treated with dHF to generate a surface that is terminated with silicon hydrogen (Si—H) bonds, negative tone development (NTD) resists patterned using extreme ultra violet (EUV) lithography provided significantly better patterning performance than when amorphous silicon (Si) is treated with HDMS prior to resist coating. Exemplary applications/uses to which the present invention can be applied include, but are not limited to: digital logic devices (e.g., AND gates, NAND gates, NOR gates, etc.), and memory devices (e.g., SRAM, DRAM, etc.). The methods and structure of the present disclosure are now described with greater detail with reference to FIGS. 1-6.

Figure 1:
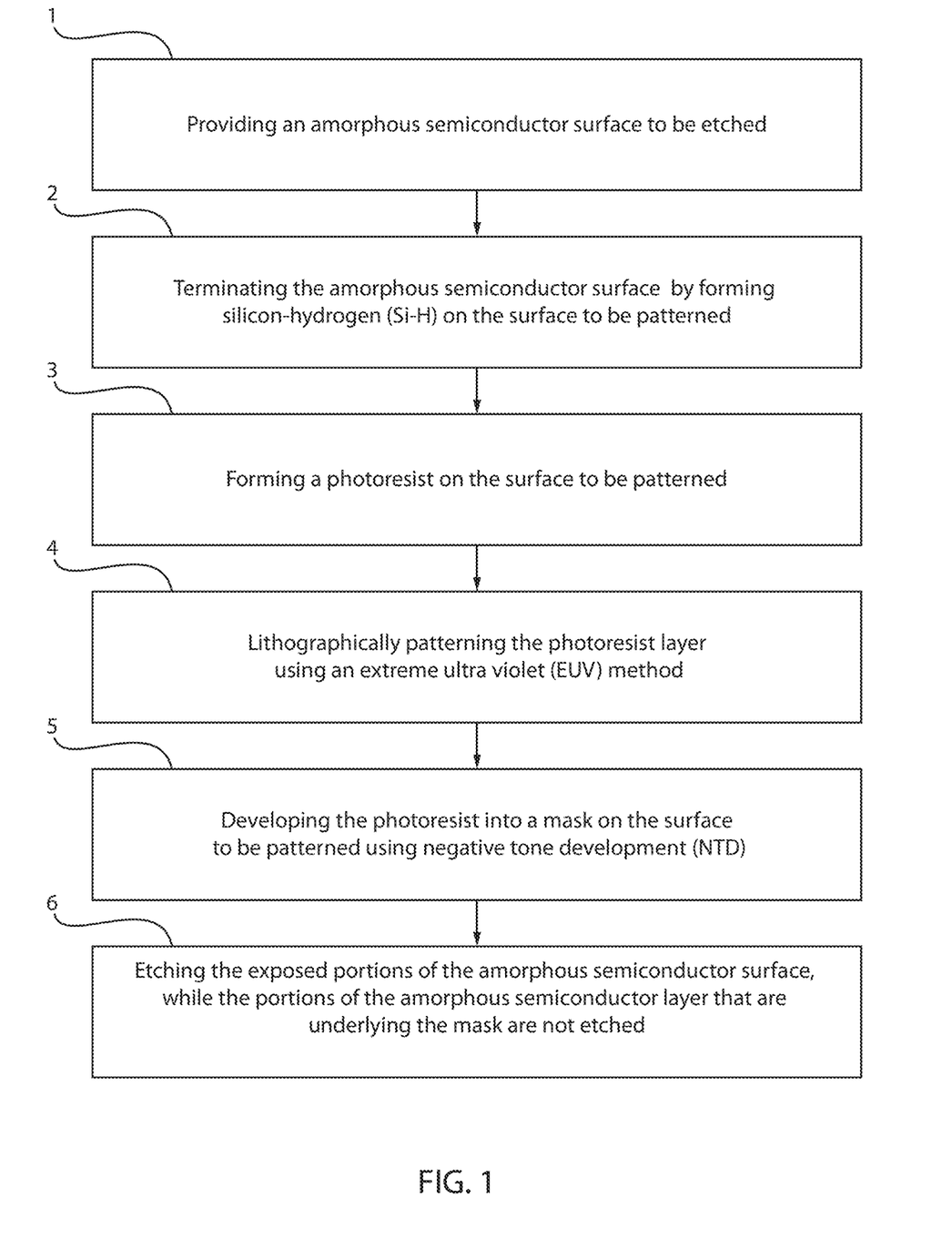
FIG. 1 is a flow diagram illustrating one embodiment of an etch method using the photolithography process that includes a step of treating the amorphous silicon surface to be etched to terminate the surface with silicon-hydrogen (Si—H) bonds prior to forming a photoresist layer on the surface to be patterned.
Figure 2:
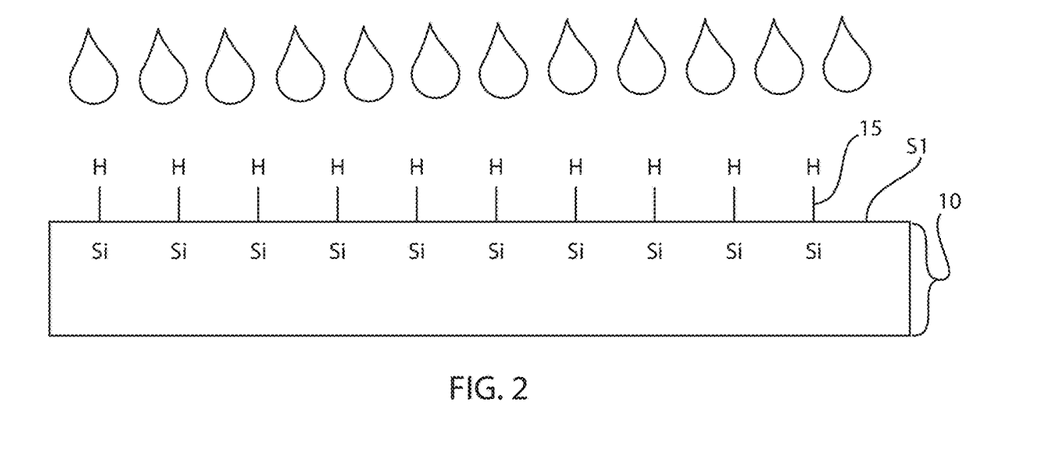
FIG. 2 is a side cross-sectional view depicting one embodiment of providing an amorphous semiconductor surface to be etched, and terminating the amorphous semiconductor surface by forming silicon-hydrogen (Si—H) bonds on the surface to be patterned, in accordance with one embodiment of the present disclosure.

In some embodiments, the method can begin with providing an amorphous semiconductor surface to be etched, and terminating the surface of an amorphous semiconductor layer 10 by forming silicon-hydrogen (Si—H) bonds 15 on the surface S1 to be patterned at Step 1 of the process flow depicted in FIG. 1, as illustrated in FIG. 2. The term "amorphous" denotes that the semiconductor material does not have a regular repeating crystalline structure. The amorphous semiconductor layer 10 may be entirely amorphous, e.g., amorphous silicon ($\alpha$-Si) and may also include an amorphous matrix with islands of crystalline material, such as in microcrystalline silicon or nanocrystalline silicon. Although FIG. 2 depicts that the amorphous semiconductor layer 10 is an independent layer, other embodiments have been contemplated in which the amorphous layer is a component of a material stack of other semiconductor materials, such as type IV and type III-V semiconductor materials, that may have crystalline, e.g., single crystalline, or amorphous crystal structures; or the amorphous semiconductor layer 10 may be present atop a supporting substrate, which may be composed of a semiconductor material, e.g., type IV and/or type III-V. It is not required that the supporting substrate be composed of semiconductor material, as other dielectric materials, such as oxides, nitrides and glass compositions, and metal materials may be suitable for providing a supporting substrate for the amorphous semiconductor layer 10. In some examples, the supporting substrate for the amorphous semiconductor layer 10 may be a polymeric material.

The surface of the amorphous semiconductor layer 10 may be treated to terminate the semiconductor surface S1 with hydrogen bonded to the semiconductor surface S1. For example, when the amorphous semiconductor layer 10 is composed of amorphous silicon (α-Si), the semiconductor surface S1 may be terminated with silicon hydrogen (Si—H) bonding.

To provide a terminated surface, the surface S1 of the amorphous semiconductor layer 10 may be treated with a hydrofluoric (HF) based chemical. In some embodiments, prior to applying the dilute hydrofluoric acid (dHF) rinse, the surface S1 of the amorphous semiconductor layer 10 may be cleaned using one of acetone, methanol, and deionized water.

In some embodiments, the surface S1 of the amorphous semiconductor layer 10, i.e., a surface composed of amorphous silicon (α-Si), is treated with a wet chemical rinse including dilute hydrofluoric acid (dHF), which terminates the amorphous silicon with hydrogen to silicon (Si—H) bonding. It is noted that prior to being terminated with semiconductor-hydrogen bonding, e.g., silicon-hydrogen (Si—H) bonding, the dilute HF rinse may remove any naturally forming oxide, e.g., silicon oxide, that may be present on the semiconductor surface S1.

In one example, the dilute hydrofluoric acid (dHF) rinse that is used to terminate the surface S1 of the amorphous semiconductor layer 10 can include a very highly diluted HF mixture, e.g., less than 0.1%. The dilute hydrofluoric (dHF) acid rinse is an aqueous solution. It is noted that the previous example of a 0.1% diluted HF mixture is only one example of a diluted HF (dHF) rinse that is suitable for terminating the amorphous semiconductor layer 10. For example, the dilute HF (dHF) rinse may include hydrofluoric acid (dHF) in amounts equal to 10%, 5%, 3%, 1%, 0.5%, 0.3%, 0.1%, 0.09%, 0.08%, 0.07%, 0.06%, 0.05%, 0.04%, 0.03%, 0.02%, 0.01%, as well as any range including one of the aforementioned examples for the maximum value of the range, and one of the aforementioned examples for the minimum value of the range. It is noted that the HF-based chemical is not limited to only the aforementioned dHF solution. For example, in some embodiments the HF-based chemical may be a buffered hydrofluoric acid (BHF) solution, which is a mixed solution of dHF and $NH_4F$.

The HF-based chemical, e.g., dilute hydrofluoric acid (dHF) rinse, may be applied by dipping the surface S of the amorphous semiconductor layer 10 into a dHF bath. In other embodiments, the dilute hydrofluoric acid (dHF) rinse may be applied by pouring, e.g., via curtain pouring, the dHF onto the surface S1 of the amorphous semiconductor layer 10. In yet other embodiments, the dilute hydrofluoric acid (dHF) rinse is applied by spray and/or brush.

The application of the HF-based chemical, e.g., dilute HF (dHF) rinse, may be at room temperature, e.g., 20° C. or 25° C., at 1 atm. In some embodiments, the temperature for the application of the HF-based chemical, e.g., dilute HF (dHF) rinse, may be at a temperature elevated from room temperature. For example, in some instances, the temperature for the application of the HF-based chemical, e.g., dilute HF (dHF) rinse, can range from 70° C. to 80° C.

As noted above, in addition to terminating the surface S1 with silicon to hydrogen bonding, the application of the HF-based chemical, e.g., dilute HF (dHF) rinse, typically removes the native oxide that is present on the surface S1 of the amorphous semiconductor layer 10. Because the native oxide, e.g. silicon oxide ($SiO_2$), that is present on the surface of the amorphous semiconductor layer 10 is relatively thin, e.g., less than 1 nm, the concentration of the HF-based chemistry may be dilute, e.g., dHF, and the time period for the application of the HF-based chemical, e.g., dHF, may be relatively short. For example, the processing time for the application of the HF-based chemical, e.g., dHF, that removes the native oxide and terminates the surface S1 of the amorphous semiconductor layer 10 may be applied for a time period of 1 minute or less. It is noted that the above example is provided for illustrative purposes only, and is not intended to limit the present disclosure. For example, the application time for the HF-based chemical. e.g., dilute HF (dHF) rinse, may be equal to 5 seconds, 15 seconds, 30 seconds, 1 minute, 2 minutes, 3 minutes, 5 minutes, 10 minutes, 15 minutes, 30 minutes and 1 hour, as well as any range including one of the aforementioned examples for the maximum value of the range, and one of the aforementioned examples for the minimum value of the range.

Following application of the HF-based chemical, e.g., dHF, that removes the native oxide and terminates the surface S1 of the amorphous semiconductor layer 10, the now terminated surface S1 of the amorphous semiconductor layer 10 may be rinsed with deionized water. In some examples, any acidity may be neutralized using a more basic composition to neutralize and rinse the terminated surface.

Terminating the surface S1 of the amorphous semiconductor layer 10 may be characterized as being silicon-hydrogen (Si—H) bond 15 terminated. By stripping the native oxide with a HF-based chemical rinse, such as dHF, thereby converting the terminal surface functionality from polar (Si—OH) to non-polar (Si—H). Hydrophilic and hydrophobic molecules are also known as polar molecules and non-polar molecules, respectively. The term "hydrophobic" means tending to repel or fail to mix with water. The term "hydrophilic" refers to a surface having a strong affinity for water. It is noted that termination of the S1 of the amorphous semiconductor layer 10 can form silicon-hydrogen (Si—H) bonds in the form of Si—H. ≡SiH, =$SiH_2$, —$SiH_3$, or a combination thereof.

Figure 3:
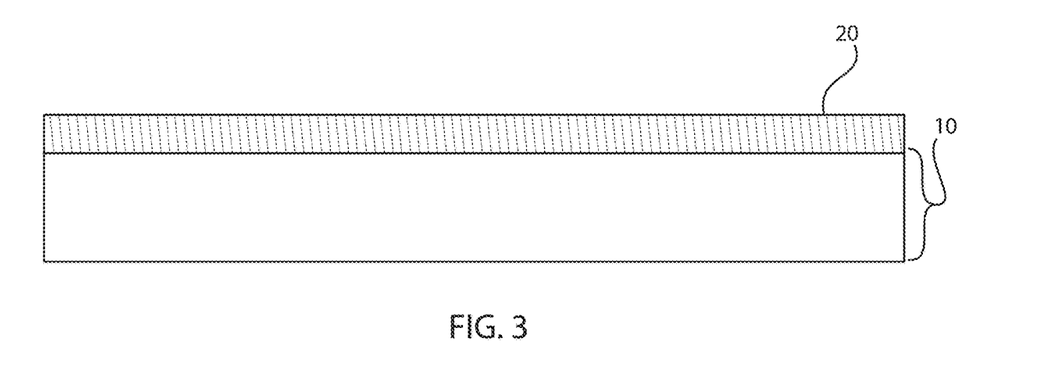
FIG. 3 is a side cross-sectional view depicting forming a photoresist on the surface to be patterned.

Referring to FIG. 1, following termination of the surface S1 of the amorphous semiconductor layer 10 to produce a Si—H bonded surface having non-polar characteristics, the method may continue with forming a forming a photoresist layer 20 on the surface S1 to be patterned at step 3, as depicted in FIG. 3. The photoresist layer 20 that is deposited is suitable for negative tone development (NTD). The negative tone development process can employ NTD solvents such as n-butyl acetate, 2-heptanone, anisole, methyl benzoate and acetophenone.

Photoresists that can provide the photoresist layer 20 for the negative tone development process, i.e., negative tone development resists (NTDRs), may be phenolic, acrylic or hybrid (phenolic-acrylic) chemically amplified photoresists.

In a first embodiment, a phenolic NTDR can be a copolymer of polyhydroxystyrene modified with a ketal-based protecting group or a tert-butyloxycarbonyl protecting group. The phenolic NTDR can be formulated by dissolution of the phenolic resin, a suitable photoacid generator such as triphenylsulfonium perfluorobutanesulfonate and a base quencher such as tetrabutylammonium lactate in an organic solvent such as propylene glycol monomethyl ether acetate. The thickness of the deposited layer may be smaller than 100 nm. For example, the thickness of the deposited NTDR resist may range from 50 nm to 30 nm in order to make it suitable for high resolution patterning, i.e., for the patterning of sub-40 nm pitched structures.

In a second embodiment, an acrylic NTDR can be a copolymer of norbornane lactone methacrylate (NLM) and methyl adamantane methacrylate (MAdMA). The acrylic NTDR can be formulated by dissolution of the acrylic resin, a suitable photoacid generator such as triphenylsulfonium perfluorobutanesulfonate, and a base quencher, such as tetrabutylammonium lactate in an organic solvent such as cyclohexanone. The thickness of the deposited layer may be smaller than 100 nm. For example, the thickness of the deposited NTDR resist may range from 50 nm to 30 nm in order to make it suitable for high resolution patterning, i.e., for the patterning of sub-40 nm pitched structures.

In a third embodiment, a hybrid NTDR can be a copolymer of polyhydroxystyrene and methyl adamantane methacrylate (MAdMA). The hybrid NTDR can be formulated by dissolution of the hybrid resin, a suitable photoacid generator such as triphenylsulfonium perfluorobutanesulfonate and a base quencher such as tetrabutylammonium lactate in an organic solvent such as propylene glycol monomethyl ether acetate. The thickness of the deposited layer may be smaller than 100 nm. For example, the thickness of the deposited NTDR resist may range from 50 nm to 30 nm in order to make it suitable for high resolution patterning, i.e., for the patterning of sub-40 nm pitched structures.

It is noted that the above examples of resists suitable for negative tone development (also referred to as NTD resists) are provided for illustrative purposes only, and are not intended to limit the present disclosure. Other compositions for NTD resists are also applicable to the present disclosure including polymers, such as polycarbonates, polyimides, polyesters, polyalkenes, copolymers thereof and combinations thereof.

In general, any suitable coating process can be used to deliver the photoresist layer 20 to the terminated surface S1 of the amorphous semiconductor layer 10. Suitable coating approaches can include, for example, spin coating, spray coating, dip coating, knife edge coating, printing approaches, such as inkjet printing and screen printing, and the like. Some of these coating approaches form patterns of coating material during the coating process, although the resolution available currently from printing or the like has a significantly lower level of resolution than available from radiation based patterning as described herein. The coating material can be applied in multiple coating steps to provide greater control over the coating process. For example, multiple spin coatings can be performed to yield an ultimate coating thickness desired. The thickness of the deposited layer may range from 1 nm to 500 µm. In some embodiments, the photoresist has a thickness of less than 50 nm.

In one embodiment, the photoresist layer may be deposited using spin on deposition methods, in which the spin rate for the substrate may range from 500 rpm to 10,000 rpm.

Following deposition of the photoresist layer 20, the method may continue with heating or evaporation of the solvent to harden the photoresist layer. The coating process itself can result in the evaporation of a portion of the solvent since many coating processes form droplets or other forms of the coating material with larger surface areas and/or movement of the solution that stimulates evaporation. The loss of solvent tends to increase the viscosity of the coating material as the concentration of the species in the material increases. In general, the coating material can be heated prior to radiation exposure to further drive off solvent and promote densification of the coating material.

While heating is not needed for successful application of the process, it can be desirable to heat the coated substrate to speed the processing and/or to increase the reproducibility of the process. In embodiments in which heat is applied to remove solvent, the coating material can be heated to temperatures from 45° C. to 150° C., in further embodiments from 50° C. to 130° C. and in other embodiments from 60° C. to 110° C. The heating for solvent removal can generally be performed for at least about 0.1 minute, in further embodiments from about 0.5 minutes to about 30 minutes and in additional embodiments from about 0.75 minutes to about 10 minutes. This heating process may be referred to as post-apply bake (PAB).

Figure 4:
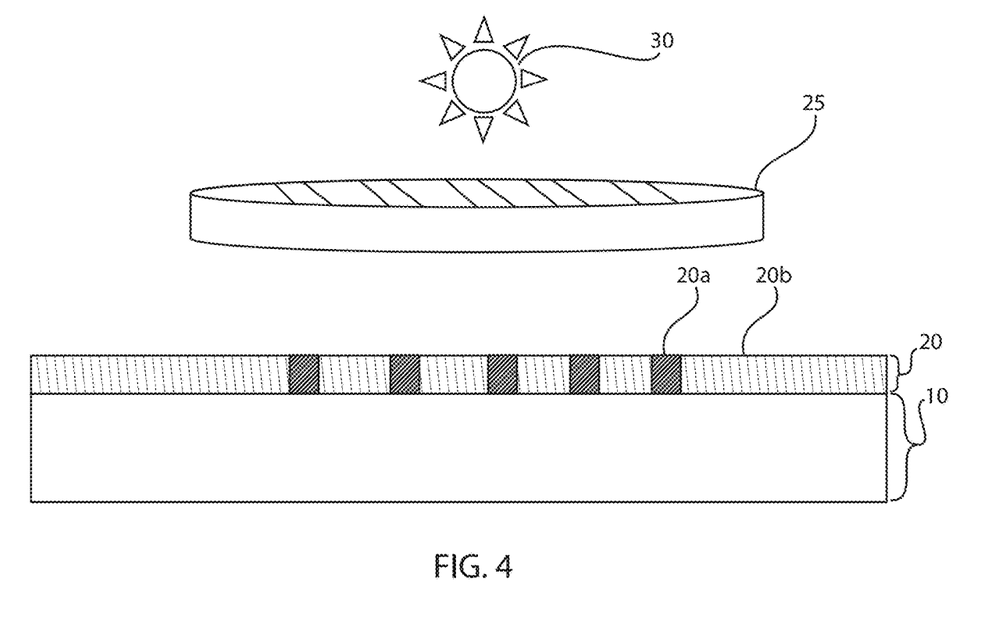
FIG. 4 is a side cross-sectional view depicting lithographically patterning the photoresist layer using an extreme ultra violet (EUV) method.

Referring to FIG. 1, following formation of the photoresist layer 20, the method may continue with lithographically patterning the photoresist layer using an extreme ultra violet (EUV) method at step 4, as illustrated in FIG. 4. In some examples, a pattern is formed using a reticle or photomask 25 and transferred into the photoresist layer 20 on the terminated surface S1 of the amorphous semiconductor layer 10. Light is reflected off the multi-mirrored surface of the reticle, which in turn produces a patterned image on the layer of photoresist. For example, exposure to light may change the exposed portions 20a of the photoresist from a soluble condition to an insoluble one. The unexposed portion 20b of the photoresist is dissolved by the photoresist developer.

The light source 30 may be an EUV light source, in accordance with one or more embodiments of the present disclosure. EUV light sources designed for lithography tools typically have high average power (e.g., 100 W and above) at 2% bandwidth with a central wavelength of 13.5 nm. Such systems typically employ a laser produced plasma (LPP) with a metal target (e.g., Sn) and a high power laser (e.g., $CO_2$ with wavelength of 10.6 µm). Such a combination is well suited for achieving high conversion efficiency (up to 4-5% in band) and high average power (about 100 W and above). In some embodiments to provide an EUV light source, a laser source is provided for initiating and/or maintaining a plasma. In this regard, the laser source may supply the energy required to rapidly heat the plasma-forming target material to a plasma, which, in turn, emits EUV light, i.e., the light source 30.

In one embodiment, the drive laser source may include, but is not limited to, one or more drive lasers. The number and type of lasers used in the drive laser source may depend on a number of factors including, but not limited to, the required power output of the individual lasers, the desired EUV light power output, and the efficiency of the EUV light generation process. As an example, EUV light is used by photolithography mask inspection systems, but such systems do not require the high EUV light power output of primary photolithography systems. An EUV mask inspection system may only require EUV light in the range of 10 W, but with high brightness in a small area. In the case of mask inspection systems, total laser output in the range of a few kilowatts is needed, with the output being focused onto a small target spot (e.g., less than 100 µm in diameter).

The drive source may include any pulsed or modulated illumination source known in the art. For example, the drive laser source may include, but is not limited to, a pulsed laser. In one embodiment, the drive laser source may include, but is not limited to, one or more solid state lasers. For example, the drive laser source may include, but is not limited to, one or more Nd:YAG, Er:YAG, Yb:YAG. Ti:Sapphire, Nd:Vanadate, and like lasers. In another embodiment, the drive laser source may include, but is not limited to, a gas-discharge laser. For example, the drive laser source may include, but is not limited to, one or more excimer lasers. In another embodiment, the drive laser source may include, but is not limited to, any laser system capable of emitting light having a wavelength less than 1 µm.

In one embodiment, the one or more laser pulses of beam to provide the light source 30 may include a train of pulses with duration in the range of 5 to 50 ns. In another embodiment, the total average power of the beam outputted by the laser source may be in the range of 1-10 kW. In another embodiment, the combination of multiple laser outputs may include triggering multiple lasers synchronously.

Although the light source 30 used for patterning the photoresist is typically an EUV light source, the methods disclosed herein are also applicable to immersion photolithography. e.g., 193 nm lithography, as well as e-beam lithography.

Referring to FIG. 1, following lithographically patterning the photoresist layer 20, 20a, 20b, the method may continue with a hard bake. In general, the coating material can be heated post-radiation exposure to catalyze the cleavage of the protective group from the negative tone development resist (NTDR) in order to promote the desired solubility switch. This heating process may be referred to as post-exposure bake (PEB).

Figure 5:
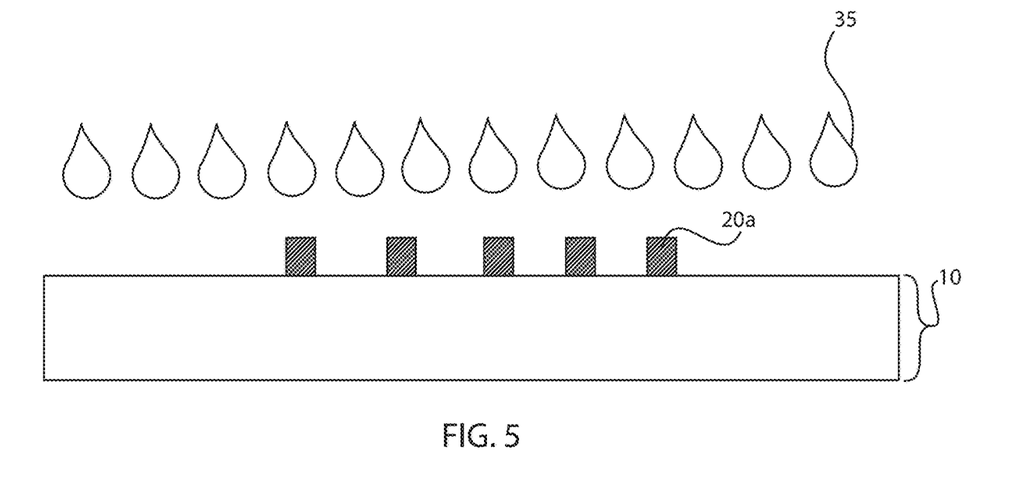
FIG. 5 is a side cross-sectional view depicting a photoresist being developed into a mask on the surface to be patterned using negative tone development (NTD).

In embodiments in which heat is applied to drive the deprotection reaction of the chemically amplified resist, the coating material can be heated to temperatures from 45° C. to 150° C., in further embodiments from 50° C. to 130° C. and in other embodiments from 60° C. to 110° C. The post-exposure bake (PEB) can generally be performed for at least about 0.1 minute, in further embodiments from about 0.5 minutes to about 30 minutes and in additional embodiments from about 0.75 minutes to about 10 minutes. Referring to FIG. 1, following post-exposure baking of the photoresist layer 20, 20a, 20b, the method may continue with a development step that removes the portions of the photoresist layer 20b that were not exposed selectively to the exposed portions of photoresist layer 20a at step 5, as illustrated in FIG. 5. Development of the image involves the contact of the patterned photoresist layer 20 including the latent image to a developer composition 35 to remove the un-irradiated photoresist portions 20b.

In general, the developer composition 35 can be comprised of organic solvents suitable for the NTD process.

In one embodiment, the developer composition can be n-butyl acetate (n-BA). Commercial n-butyl acetate (n-BA) is available from Eastman Chemical Co. In another embodiment., the developer can be 2-heptanone. In a yet another embodiment, the developer can be anisole. In a further embodiment, the developer can be methyl benzoate. In yet a further embodiment, the developer can be acetophenone. In even further embodiments, the developer can consist of mixtures based on organic solvents of the previous embodiments.

The developer can be applied to the patterned coating material using any reasonable approach. For example, the developer can be sprayed onto the patterned coating material. Also, spin coating can be used. For automated processing, a puddle method can be used involving the pouring of the developer onto the coating material in a stationary format. If desired, spin rinsing and/or drying can be used to complete the development process. Suitable rinsing solutions include, for example, ultrapure water, methyl alcohol, ethyl alcohol, propyl alcohol, 4-methyl-2-pentanol and combinations thereof. After the image is developed, the coating material is disposed on the substrate as a pattern.

Figure 6A:
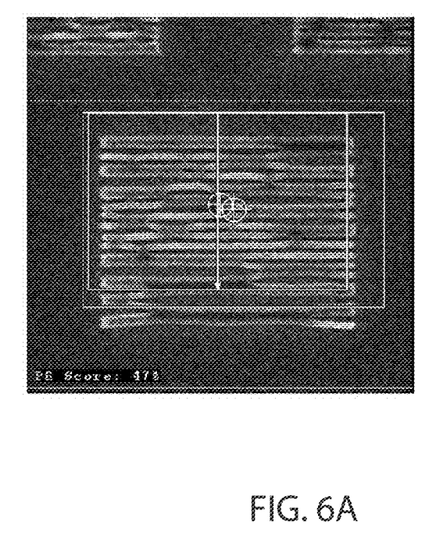
FIG. 6A is a scanning electron microscope (SEM) image of a negative tone developed resist that was formed on an amorphous silicon surface that was pretreated with hexamethyldisilazane (HDMS) prior to forming the photoresist layer.
Figure 6B:
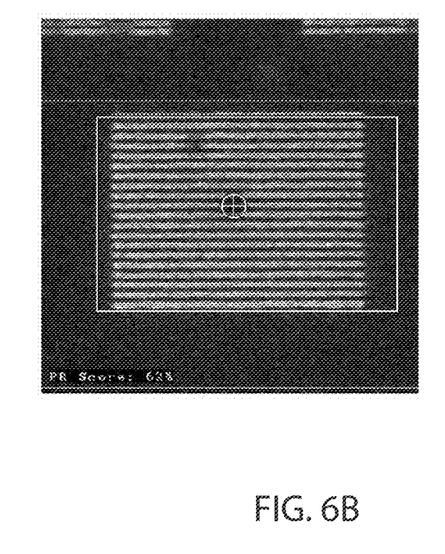
FIG. 6B is a scanning electron microscope (SEM) image of a negative tone developed resist that was formed on an amorphous silicon surface that was pretreated with dilute hydrofluoric acid (dHF) prior to forming the photoresist layer, in accordance with one embodiment of the present disclosure.

As noted above, resist-inorganic hardmask adhesion hindered patterning fidelity. Priming a surface with hexamethyldisilazane (HDMS) was the prior method to improve adhesion and pattern performance on silicon (Si), e.g., amorphous silicon (α-Si), crystalline silicon (c-Si), and combinations thereof, or silicon oxide, e.g., low temperature oxide (LTO) substrates. As noted above, it has been determined that resist adhesion under these circumstances is marginal for resolution patterning in the sub 40 nm pitch realm (sub-40P). This is especially the case with negative tone resist development and exposure with extreme ultraviolet lithography. It has been determined that using the methods described above, amorphous silicon (α-Si) or crystalline silicon (c-Si) can be stripped of their native oxide, e.g., silicon oxide, without HDMS using the an HF-based chemical, such as dilute HF, thereby converting the terminal surface functionality from polar (SiOH) to non-polar (Si—H), similar to the surface functionality provided by the above described dilute HF including process. In some embodiments, the patterning performance with negative tone development (NTD) of corresponding photoresists is improved with the silicon hydrogen (Si—H) bonded surface in comparison to the patterning performance of similarly prepared photoresists formed over surfaces treated with hexamethyldisilazane (HDMS). The performance increase provided by the HF including chemical surface treatment, e.g., dilute HF (dHF), is applicable to extreme ultraviolet (EUV) photolithography, but is also applicable to immersion photolithography. e.g., 193 nm lithography, as well as e-beam lithography FIG. 6A is a scanning electron microscope (SEM) image of a negative tone developed resist that was formed on an amorphous silicon surface that was pretreated with hexamethyldisilazane (HDMS) prior to forming the photoresist layer. The pattern depicted in FIG. 6A is a comparative example. FIG. 6B is a scanning electron microscope (SEM) image of a negative tone developed resist that was formed on an amorphous silicon surface that was pretreated with dilute hydrofluoric acid (dHF) prior to forming photoresist layer, as illustrated above in accordance with process flow described with reference to FIG. 1. Both wafers depicted in FIGS. 6A and 6B were coated with an EUV NTD resist followed by an e-beam exposure of P40 equal line/space patterns. The wafers were subsequently post-exposure baked and developed using n-butyl acetate (n-BA). The comparative example depicted in FIG. 6A illustrates merger of the lines indicative of poor adhesion and lift off. The example depicted in FIG. 6B is a set of parallel lines having no merger, which is indicative of good adhesion and substantially eliminated lift off when compared to the photoresist lines depicted in FIG. 6A.

Figure 7:
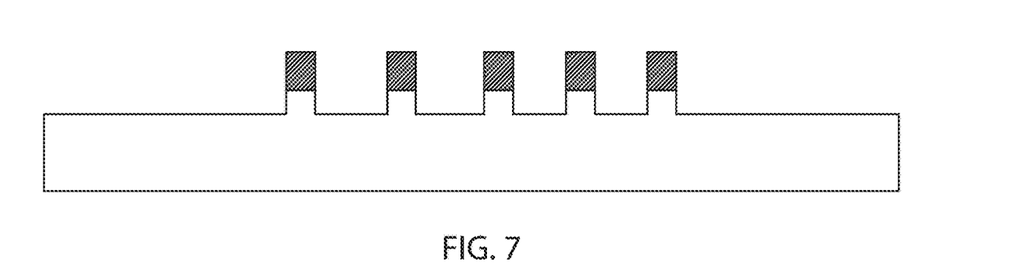
FIG. 7 is a side cross-sectional view depicting one embodiment of etching the exposed portions of the amorphous semiconductor surface, while the portions of the amorphous semiconductor layer that are underlying the mask are not etched.

Referring to FIG. 1, following development of the lithographically patterning the photoresist layer, the method may continue with etching the underlying amorphous semiconductor layer 10 at step 6, as illustrated in FIG. 7. The etch process for etching the underlying semiconductor layer 10 is selective to the remaining portions of the photoresist layer 20a that provide a photoresist mask. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater.

In one embodiment, the semiconductor layer 10 may be etched using an anisotropic etch. As used herein, an "anisotropic etch process" denotes a material removal process in which the etch rate in the direction normal to the surface to be etched is greater than in the direction parallel to the surface to be etched. The anisotropic etch may be reactive ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

In some embodiments, the semiconductor layer 10 is etched to provide an ultrathin, e.g., less than 5 nm thick, patterned inorganic hardmask, e.g., a patterned inorganic hardmask composed of amorphous silicon (α-Si). The methods and structures disclosed herein may also be used to form a patterned hard mask that is composed of low temperature oxide (LTO) material.

The methods and structures described herein provide better resist thickness budget, higher etch selectively, lower line width roughness (LWR), improved defectivity, and increased wet strippability of materials used in photolithography processes.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B. and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a." "an" and "the" are intended to include the plural forms as well, unless the context clearly indicates otherwise. It will be further understood that the terms "comprises," "comprising." "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A patterning method comprising:
   providing an amorphous silicon surface to be patterned;
   terminating the amorphous silicon surface by forming nonpolar silicon-hydrogen (Si—H) bonds on the surface to be patterned with a dilute HF treatment of 0.1% or less hydrofluoric acid in aqueous solution applied to the amorphous silicon surface;
   forming a negative tone photoresist on the surface to be patterned, wherein the negative tone photoresist comprises an acrylic chemistry;
   patterning the negative tone photoresist lithographically using an extreme ultra violet (EUV) method, wherein interaction between the negative tone photoresist of the nonpolar silicon-hydrogen (Si—H) bond of the amorphous silicon surface resists lift off and increases pattern fidelity; and
   developing the negative tone photoresist on the surface to be patterned.

2. The method of claim 1, wherein said terminating the amorphous silicon surface comprises applying an HF-including chemistry.

3. The method of claim 2, wherein the HF-including chemistry is dilute hydrofluoric acid.

4. The method of claim 1, wherein said terminating the amorphous silicon surface comprises converting the surface from polar to non-polar.

5. The method of claim 1, wherein said terminating the amorphous silicon surface further comprises removing a native oxide.

6. The method of claim 1, wherein the forming the photoresist comprises spin on deposition.

7. A patterning method comprising:
   providing an amorphous semiconductor surface to be patterned;
   applying a dilute hydrofluoric acid (dHF) to the surface to be patterned to terminate the amorphous semiconductor surface with silicon-hydrogen bonds, the dilute HF treatment comprising 0.1% or less hydrofluoric acid in an aqueous solution;
   forming a photoresist on the surface to be patterned, wherein the photoresist comprises an acrylic chemistry;
   patterning the photoresist lithographically using an extreme ultra violet (EUV) method; and
   developing the photoresist on the surface to be patterned using negative tone development (NTD), wherein interaction between the photoresist of the nonpolar silicon-hydrogen (Si—H) bond of the amorphous semiconductor surface resists lift off and increases pattern fidelity.

8. The method of claim 7, wherein said applying the dilute hydrofluoric acid (dHF) to the surface to be patterned removes a native oxide.

9. The method of claim 7, wherein said terminating the amorphous semiconductor surface comprises converting the surface from polar to non-polar.

10. The method of claim 7, wherein the forming the photoresist comprises spin on deposition.

11. The method of claim 7, wherein said developing comprises applying n-butyl acetate (n-BA), 2-heptanone, anisole, methyl benzoate, acetophenone, or mixtures thereof.

* * * * *